US008129274B2

(12) United States Patent  (10) Patent No.: US 8,129,274 B2
Chu  (45) Date of Patent: Mar. 6, 2012

(54) METHOD FOR MAKING AN APERTURE IN A CARRIER AND ELECTRICALLY CONNECTING TWO OPPOSITE FACES OF THE CARRIER

(75) Inventor: Tse Min Chu, Taipei (TW)

(73) Assignee: Aflash Technology Co., Ltd., Taoyuan Coiunty (TW)

( * ) Notice: Subject to any disclaimer, the term of this patent is extended or adjusted under 35 U.S.C. 154(b) by 0 days.

(21) Appl. No.: 12/908,090

(22) Filed: Oct. 20, 2010

(65) Prior Publication Data

US 2011/0143536 A1  Jun. 16, 2011

(30) Foreign Application Priority Data

Dec. 3, 2009 (TW) .............................. 98222620 U

(51) Int. Cl.
*H01L 21/44* (2006.01)
(52) U.S. Cl. .. 438/667; 438/637; 438/672; 438/E21.586

(58) Field of Classification Search .......... 438/618–624, 438/637–638, 672–673, 700
See application file for complete search history.

(56) References Cited

U.S. PATENT DOCUMENTS

2011/0042803 A1* 2/2011 Chu .............................. 257/737

* cited by examiner

*Primary Examiner* — Dung A. Le
(74) *Attorney, Agent, or Firm* — Muncy, Geissler, Olds & Lowe, PLLC

(57) ABSTRACT

Disclosed is a method for making an aperture in a carrier and electrically connecting two opposite faces of the carrier. At first, a carrier is provided. Secondly, a heater is provided for heating a portion of the carrier in an environment rich in oxygen, thus making an aperture in the carrier and forming an isolative layer on the wall of the aperture synchronously. Finally, the aperture is filled with a conductive material.

11 Claims, 3 Drawing Sheets

METHOD FOR MAKING AN APERTURE IN A CARRIER AND ELECTRICALLY CONNECTING TWO OPPOSITE FACES OF THE CARRIER

BACKGROUND OF INVENTION

1. Field of Invention

The present invention relates to the production of a semiconductor device and, more particularly, to an efficient and reliable method for making an aperture in a carrier and electrically connecting two opposite faces of the carrier.

2. Related Prior Art

To make a semiconductor device, a carrier is made with apertures. An isolative layer is provided on the wall of each of the apertures by printing, coating, spraying, chemical vapor deposition, physical vapor deposition, sputtering, electroplating, or non-electroplating means. Thus, short circuit between two opposite faces of the carrier is avoided. Finally, a conductive material is filled in each of the apertures. Thus, the opposite faces of the carrier are electrically connected to each other.

As mentioned above, the conventional process for making the semiconductor device includes three steps of making the apertures, providing the isolative layers, and filling the conductive material. The conventional process is however complicated. Moreover, the yield of the conventional process is low, and the resultant semiconductor is not reliable.

The present invention is therefore intended to obviate or at least alleviate the problems encountered in prior art.

SUMMARY OF INVENTION

It is the primary objective of the present invention to provide an efficient method for making a reliable semiconductor device.

To achieve the foregoing objective, in the method, at first, a carrier is provided. Secondly, a heater is provided for heating a portion of the carrier in an environment rich in oxygen, thus making an aperture in the carrier and forming an isolative layer on the wall of the aperture synchronously. Finally, the aperture is filled with a conductive material.

Other objectives, advantages and features of the present invention will be apparent from the following description referring to the attached drawings.

BRIEF DESCRIPTION OF DRAWINGS

The present invention will be described via detailed illustration of the preferred embodiment referring to the drawings wherein.

DETAILED DESCRIPTION OF PREFERRED EMBODIMENT

Figure 1:
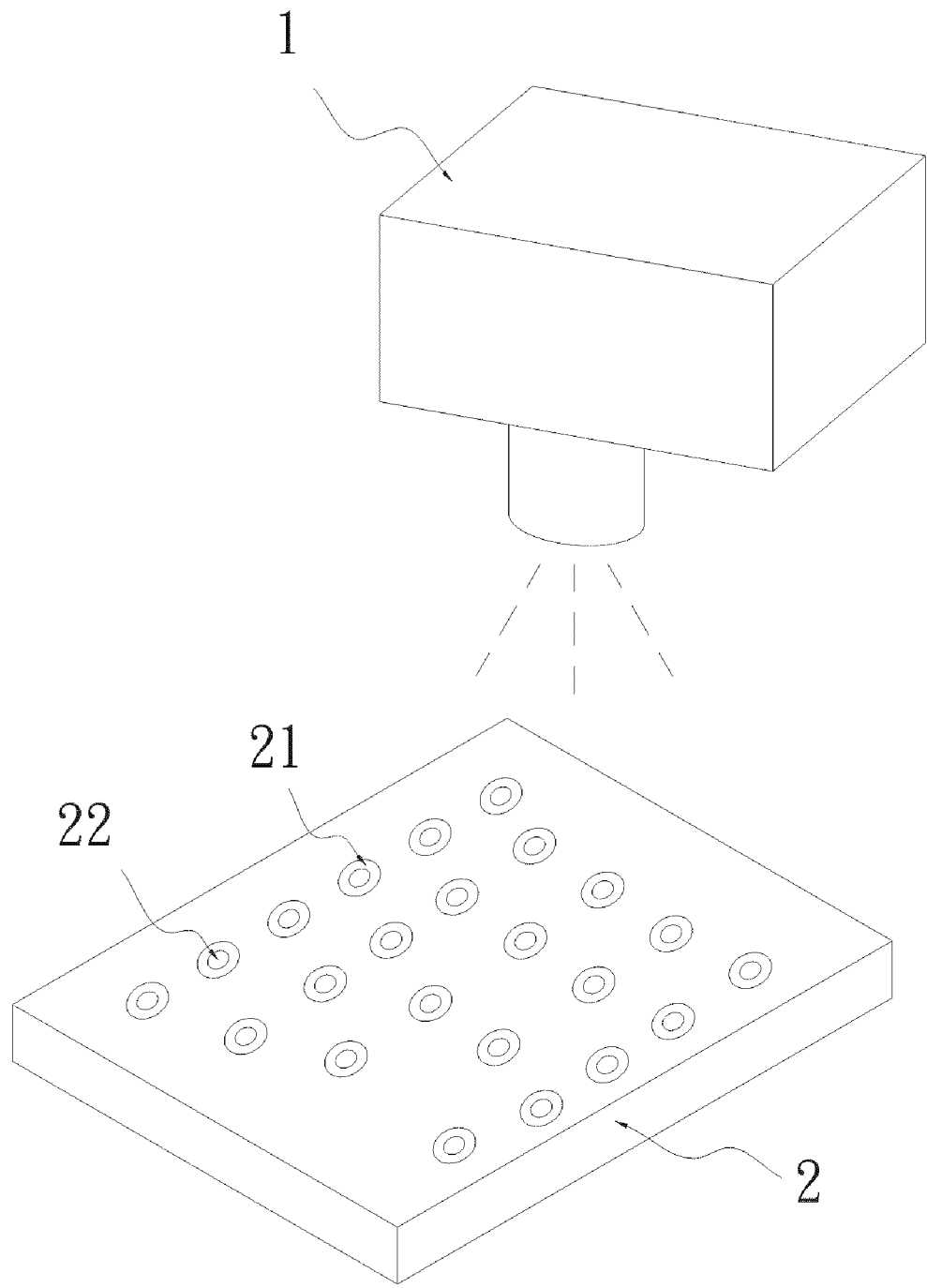
FIG. 1 is a perspective view of a heater used in a method for making an aperture in a carrier and electrically connecting two faces of the carrier to each other according to the preferred embodiment of the present invention.
Figure 2:
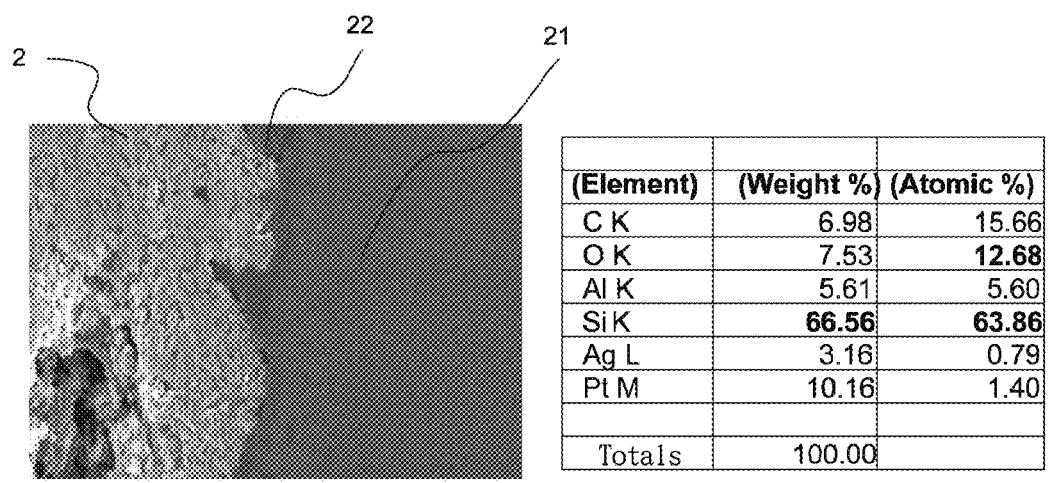
FIG. 2 is a photograph view of a portion of the carrier shown in FIG. 1.
Figure 3:
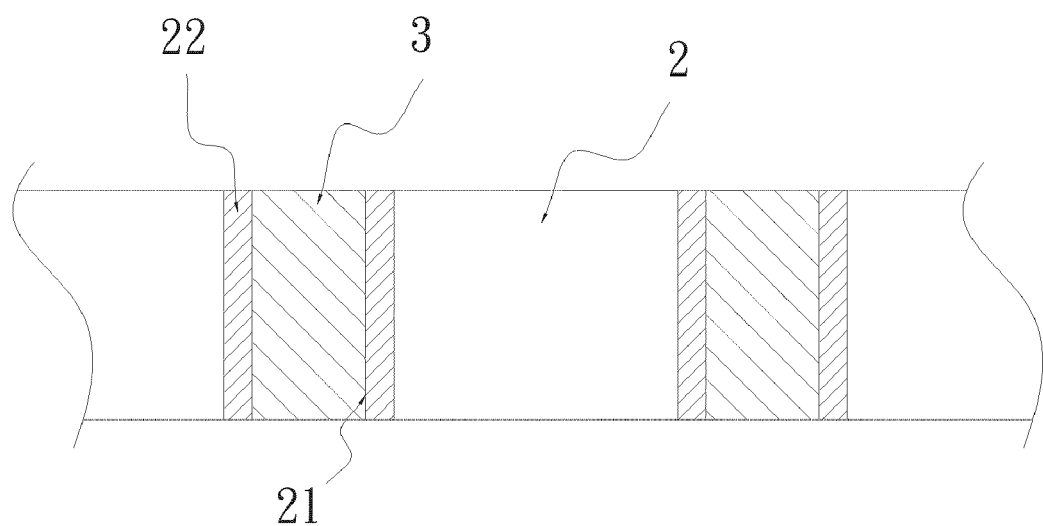
FIG. 3 is a cross-sectional view of the carrier shown in FIG. 1.

Referring to FIGS. 1 through 3, there is shown a method for making an aperture 21 in a carrier 2 and electrically connecting two opposite faces of the carrier 2 to each other according to the preferred embodiment of the present invention. Referring to FIG. 1, there is shown a heater 1 for making the aperture 21 in the carrier 2 and forming an isolative layer 22 on the wall of the aperture 21 synchronously. The heater 1 is used to emit laser or a heat ray. The carrier 2 is a P-type or N-type element made of silicon doped with boron, phosphor, arsenic or antimony.

The carrier 2 is located under the heater 1. A portion of the carrier 2 in which the aperture 21 is to be made is aligned to the heater 1. The heater 1 is turned to emit laser or a heat ray to the portion of the carrier 2. The laser or hat ray heats and melts the portion of the carrier 2 in an environment rich in oxygen. Thus, the aperture 21 is made (FIG. 2). Synchronously, the material of the portion of the carrier 2 is oxidized because of the heat and the oxygen and turned into the isolative layer 22 on the wall of the aperture 21. Obviously, the isolative layer 22 is made of silicon dioxide.

Finally, a conductive material 3 is filled in the aperture 21 (FIG. 3). Thus, two opposite faces of the carrier 2 are electrically connected to each other. The conductive material 3 can be silver paste for example.

The method of the present invention can be used in a memory-making process or a CMOS process. As discussed above, the making of the aperture 21 and the forming of the isolative layer 22 are conducted synchronously. Therefore, the method of the present invention is simple and therefore efficient. In addition, the resultant carrier 2, which includes the aperture 21, the isolative layer 22 and the conductive material 3, is reliable.

The present invention has been described via the detailed illustration of the preferred embodiment. Those skilled in the art can derive variations from the preferred embodiment without departing from the scope of the present invention. Therefore, the preferred embodiment shall not limit the scope of the present invention defined in the claims.

The invention claimed is:

1. A method for making an aperture in a carrier and electrically connecting two opposite faces of the carrier including the steps of:
   providing a carrier;
   providing a heater to emit a laser for heating a predetermined position of an aperture of the carrier 2 in an environment rich in oxygen, so as to make the aperture in the carrier and form an isolative layer on an inner wall of the aperture synchronously; and
   filling the aperture with a conductive material.

2. The method according to claim 1, wherein the carrier is made of silicon.

3. The method according to claim 1, wherein the carrier is a N-type element made of silicon doped with at least one material selected from the group consisting of boron, phosphor, arsenic or antimony.

4. The method according to claim 1, wherein the carrier is a P-type element made of silicon doped with at least one material selected from the group consisting of boron, phosphor, arsenic or antimony.

5. The method according to claim 1, wherein the isolative layer is made of silicon dioxide.

6. The method according to claim 1, wherein the conductive material is silver paste.

7. An aperture in a carrier and electrically connecting two opposite faces of the carrier comprising:
   a carrier; and
   at least an aperture in the carrier formed by a laser and filled with silver paste;
   wherein formation of the aperture filled with silver paste comprising the following steps:
      providing a carrier;

providing a heater to emit the laser for heating a predetermined position of the aperture of the carrier in an environment rich in oxygen, so as to make the aperture in the carrier and to form an isolative layer on the inner wall of the aperture synchronously; and filling the aperture with a conductive material.

8. The method according to claim 7, wherein the carrier is made of silicon.

9. The aperture in a carrier and electrically connecting two opposite faces of the carrier according to claim 8, wherein the carrier is a N-type element made of silicon doped with at least one material selected from the group consisting of boron, phosphor, arsenic or antimony.

10. The aperture in a carrier and electrically connecting two opposite faces of the carrier according to claim 8, wherein the carrier is a P-type element made of silicon doped with at least one material selected from the group consisting of boron, phosphor, arsenic or antimony.

11. The aperture in a carrier and electrically connecting two opposite faces of the carrier according to claim 8, wherein the isolative layer is made of silicon dioxide.

* * * * *